(12) United States Patent
Knight et al.

(10) Patent No.: US 6,838,964 B1
(45) Date of Patent: Jan. 4, 2005

(54) METHOD AND APPARATUS FOR MONITORING SUPERCONDUCTING MAGNET DATA

(75) Inventors: Larry Keith Knight, Sand Springs, OK (US); Peter Chan, Harland, WI (US)

(73) Assignee: GE Medical Technology Services, Inc., Pewaukee, WI (US)

( * ) Notice: Subject to any disclaimer, the term of this patent is extended or adjusted under 35 U.S.C. 154(b) by 0 days.

(21) Appl. No.: 10/723,674

(22) Filed: Nov. 26, 2003

(51) Int. Cl.[7] .............................................. H01F 6/00
(52) U.S. Cl. ...................... 335/216; 324/318; 324/319; 361/141; 340/539.12; 700/90
(58) Field of Search .................... 335/216, 296–301; 361/139, 141, 170–172, 178; 324/318–320; 600/407, 410; 340/539.12, 539.18, 825.36; 128/903; 700/90

(56) References Cited

U.S. PATENT DOCUMENTS 6,101,407 A * 8/2000 Groezinger ................. 600/407
6,621,413 B1 * 9/2003 Roman et al. ........... 340/539.12
6,754,545 B2 * 6/2004 Haeuser et al. ............... 700/90

* cited by examiner

*Primary Examiner*—Ramon M. Barrera
(74) *Attorney, Agent, or Firm*—Fletcher Yoder (57) ABSTRACT

Remote monitoring of superconducting magnet systems of various types, manufacturers, vintages, and so forth, via a magnet selector interface providing for configuring the monitoring system to the particular magnet system of interest. The technique provides for scalable analogue to digital conversion with integrated excitation circuitry for the input and output of magnet system sensors. Devices, such as remote terminal units and other data-logging technology may be adapted to remotely monitor primary indicators and secondary indicators of magnet system performance and related boil-off of helium. The technique provides earlier warning of impending failures in the magnet system, and thus facilitates predictive maintenance, reduces maintenance costs, reduces MRI downtime, reduces helium loss, and the like.

47 Claims, 5 Drawing Sheets

METHOD AND APPARATUS FOR MONITORING SUPERCONDUCTING MAGNET DATA

BACKGROUND OF THE INVENTION

The present technique relates to medical imaging devices and, more particularly, to imaging devices with cryogenic cooling systems.

A number of important applications exist for superconductive magnet systems. These include imaging systems, as for medical imaging, as well as spectrometry systems, typically used in materials analysis and scientific research applications. The present technique relates to management of cryogenically cooled superconductive magnets, and particularly to the monitoring and servicing of such systems. Although reference is made throughout the following discussion to imaging systems, it should be borne in mind that the technique is applicable to a range of systems that utilize cryogenically cooled superconducting magnets.

Imaging devices are omnipresent in typical medical and other environments. Medical practitioners, such as physicians, may employ medical imaging devices to diagnose patients. Imaging devices, such as Magnet Resonance Imaging (MRI) devices and Nuclear Magnetic Resonance (NMR) devices, produce detailed images of a patient's internal tissues and organs, thereby mitigating the need for invasive exploratory procedures and providing valuable tools for identifying and diagnosing disease and for verifying wellness.

Typical MRI and NMR devices develop diagnostic images by affecting gyromagnetic materials within a patient via controlled gradient magnetic fields and radiofrequency pulses in the presence of a main magnetic field developed by a superconductive magnet. During an MRI exam, a main magnetic field of upwards of two Tesla may be necessary to produce vivid images. Typically, superconductive electromagnets comprise loops of coiled wire, which are continuously bathed in a cryogen, such as liquid helium, at temperatures near absolute zero. For the example of bathing the coils with a liquid pool of helium, system temperatures are approximately −269° C. (or 4 K) near atmospheric pressure (e.g. less than 5 psig). When cooled to such extreme temperatures, the coiled wire becomes superconductive, i.e., the electrical resistance of the wire falls to essentially zero, enhancing the field strength without requiring significant energy input for continued operation. Advantageously, superconductive electromagnets reduce the electrical load requirements for producing the desired magnetic fields, thereby making the MRI system more economical to operate.

Challenges exist, however, in maintaining the electromagnets at these extreme temperatures which are significantly lower than ambient temperatures. Because of this temperature difference with ambient, a considerable driving force exists for heat transfer from the environment into the magnet system. Accordingly, thermal insulating material and other heat transfer barriers, such as vacuum regions, may insulate the magnet and cryogen to impede heat transfer from the environment. For environmental heat effects that reach the inner workings of the magnet system, the liquid pool of cryogen that surrounds the magnet may absorb the heat to maintain the magnet at desired temperature. Cryogens operating at or near their boiling points typically expend this external heat by vaporizing relatively small amounts of cryogen.

In general, the cryogen liquid pool and its heat of vaporization consume heat while maintaining the magnet at constant temperature. On the whole, cryogen liquid pools in well-insulated systems, such as typical superconducting magnet systems, are able to absorb heat transferred from the environment over relatively long periods of time to maintain the magnet at desired temperature. Cryogenic liquids, such as liquid helium, however, are relatively expensive to produce and maintain. Therefore, older approaches of "open" systems which have no recondensing capability and where cryogen vapor is normally vented to the atmosphere, have generally fallen out of favor in the industry. In these systems, as the liquid cryogen absorbs environmental heat in maintaining the desired magnet temperature, vaporized cryogen is normally vented to limit pressure increases and thus to limit temperature increases.

Accordingly, to conserve cryogen, such as helium, and to support cryogen pressure control, magnet systems in typical MRI devices may now include a cryogen condensing system, which recondenses volatilized cryogen back into its liquid phase. That is, cryogen is maintained in a sealed cryogen vessel (or cryostat) that provides cryogen vapor (i.e., gaseous helium) to the condensing system and receives liquid cryogen (i.e., liquid helium) from the condensing system in a closed loop process. The condensing system condenses cryogen vapor, thus recovering the vapor, as well as, maintaining the cryogen pressure below the set point of the vent or relief device. In contrast, for low operating pressures, as discussed more below, a heater may be used to prevent the cryogen pressure from dropping too low. In sum, for the older open systems, a loss in cryogen level is expected and the timing of service intervals is typically based on this loss of level. In contrast, for recondensing magnets systems which recover the vaporized cryogen, losses in cryogen liquid level are not expected during normal operation. Thus, recondensing magnet systems generally retain cryogen level and reduce the requirement of periodic refilling of cryogen.

Recondensing magnet systems, however, from time to time, require maintenance, for example, when the cryogen condensing system may require repair or replacement. In particular, the performance of the condensing system components may degrade, thereby reducing the efficacy of the condensing system and overall magnet cooling system (cryogenic cooling system). Moreover, leaks within the cryogen (helium) vessel and/or condensing system, again for example, may also reduce the efficacy of the cooling system. During maintenance, it may become necessary to disengage the condensing system, cooling system, and/or deactivate the MRI devices, events that are to be avoided. If the cryogen condensing system is off-line or not condensing effectively, more of the liquid cryogen may begin to volatilize, leading to an increase of pressure in the cryogen vessel (i.e., cryostat). To prevent adverse effects due to the increased pressure, traditional MRI devices, such as a relief valve installed, for example, on the cryogen vessel may relieve pressure by venting some of the gaseous cryogen to the atmosphere. This conversion of liquid cryogen, such as liquid helium, to its gaseous state, and/or the subsequent venting of the gas, is generally known in the industry as "boil-off." Venting of the gas leads to permanent loss of expensive cryogen, requiring periodic refilling of the system. Again, this venting is expected during normal operation of open systems but may be substantially avoided in recondensing systems.

Recondensing technology may provide "zero boil-off" systems in which a refrigeration system or "cold head" (also called cryo-cooler or cryo-condenser) typically runs continuously to condense (and recondense) vaporized cryogen. An electric heater in the vessel heats the cryogen to maintain a desired pressure level, thereby preventing the vessel pressure from falling below a desired level that could result in drawing atmospheric gases into the vessel. A balance is maintained between cooling components (condensing) and heating components (vaporizing) which can be continuously monitored. In contrast, with "open loop" thermal designs, such as those without recondensing technology, the expected boil-off results in a measurable drop in liquid level in the vessel over time. In some configurations, this drop in liquid level may manifest in a reduction in the reading, for example, on a provided liquid level gauge. Historically, with open systems, the percent rate of drop in a volumetric table unique to each magnet system (i.e., in each MRI system) defines the boil-off rate, for example, expressed as liters per hour consumption. For open systems, this boil-off rate is compared to design norms to determine total thermal system performance and used to determine service intervention. On the contrary, recondensing systems experience minimal loss of cryogen level, employing the refrigerating action of a cold head to provide controlled zero boil-off (COBO) with high percentage cryogen (helium) recovery. Though true zero boil-off systems are not physically possible, the operation of condensing the helium vapor and returning the condensed helium to the helium vessel (cryostat) liquid pool may approach ideal conditions.

Conventional methods of evaluating thermal system performance depend upon observing a drop in liquid level and then comparing the results to design norms. Such approaches are proving to be generally inadequate for recondensing systems. During normal and early failure modes, recondensing thermal systems, by design, exhibit no drop in liquid level over time thereby preventing prompt identification failure until the problem becomes severe enough, for example, that the pressure relief valve opens the previously closed system and gas is vented resulting in the liquid level dropping. It should be emphasized that improved monitoring and indication of magnet performance and operating variables are needed to recognize and respond to problems affecting recondensing magnet thermal performance, magnet superconductivity and field strength, MRI image quality, and so forth. Such monitoring of recondensing magnet systems is needed to facilitate predictive maintenance and effective scheduling of MRI service intervals, and to proactively reduce helium boil-off, loss of superconductivity, equipment damage, maintenance costs, MRI down time, and the like.

Traditionally, the maintenance of cryogenic cooling systems in MRI devices is a reactive process. That is, technicians are generally called when, for example, image quality has been affected, a critical indicator has activated, and/or the system is no longer operable. For example, a typical system may generate a service call when a low level of cryogen is detected due to venting or leaks in the system. In addressing concerns reactively, the repair time and/or off-line periods may be longer than desired. For example, certain parts and/or technicians may not be immediately available, leading to longer than necessary downtimes (i.e., off-line time). Moreover, periods of reactive maintenance may not coincide with already scheduled routine maintenance procedures, leading to duplicative downtimes for the MRI device. Similarly, when substantial quantities of cryogen are required, very significant costs may be incurred in refilling the serviced system.

Similar problems exist even prior to the time such magnets are placed in operation. For example, magnets are typically built and tested in a controlled factory environment, then at least partially disassembled from other support equipment for shipping. Current procedures for building, testing and shipping superconductive magnets do not, however, adequately accommodate boil-off or servicing needs. In much the same way, mobile MRI systems and systems where communications infrastructures are less available pose particular challenges beyond those of traditional fixed locations in hospitals. Such challenges include cryogen monitoring and servicing; but also location and identification of the systems, and communication of relevant parameter data to a monitoring or service-coordinating location.

Accordingly, there is a need for an improved technique for maintaining cryogenic cooling systems. Particularly, there is a need for a technique that reduces maintenance times, periods of deactivation, costs, and so forth.

BRIEF DESCRIPTION OF THE INVENTION

The present invention provides a novel technique designed to respond to such needs. The technique provides for remote monitoring of superconducting magnet systems of various types, manufacturers, vintages, and so forth. A magnet selector interface may be used to configure the monitoring system to the particular magnet system of interest. The magnet selection, for example, may be performed locally or downloaded by or from a service provider. Scalable analog-to-digital conversion reads output from the magnet system sensors and integrated excitation circuitry may scale excitation input to magnet system sensors. Devices, such as remote terminal units and other datalogging technology may be adapted to remotely monitor primary indicators and secondary indicators of magnet system performance and the related boil-off of helium. Primary indicators or variables that may be monitored include liquid helium level and pressure. In certain circumstances, primary indicators may also include, for example, helium temperature, radiation shield temperature, heater duty cycle, magnet current, and magnet field strength or frequency. Secondary indicators include, for example, operating variables and failures of the cold head, compressor, and other MRI devices. Set points for the primary and secondary indicators may be defined and compared against actual values. Alarm conditions may be specified with remote indication, for example, to a service technician and/or on-line center. The technique provides earlier warning of impending failures in the magnet system and facilitates predictive maintenance, reducing maintenance costs, MRI downtime, helium loss, and the like.

With the present technique, for example, a method for monitoring a superconducting magnet system, includes determining a magnet system type and associated sensor types of the superconducting magnet system, selecting magnet settings for a monitoring system that monitors the superconducting magnet system, such settings generally corresponding to the determined magnet type and determined sensor types, and including one or more scaling factors for analog-to-digital conversion, and programming the monitoring system in accordance with the selected magnet settings. The method also includes providing an analog signal from a sensor disposed in the superconducting magnet system, such analog signal indicative of a property of the superconducting magnet system, and scaling an analog-to-digital conversion of the analog signal based on the one or more scaling factors. The method may also include scaling an excitation current for input to the sensor, and wherein the scaling of the excitation current is based on the magnet settings. Moreover, the superconducting magnet system may provide one or more magnetic fields in a magnetic resonance (MR) imaging system; and the monitoring system monitors at least one of a cryogen level, a cryogen pressure, a cryogen temperature, a cryogen shield temperature, a magnet current, a magnet field strength and corresponding frequency, a heater duty cycle, and a cold head temperature. The sensor may be a resistance temperature detector (RTD) and the scaling factors may include a selectable voltage setting and Callendar-Van Dusen coefficients. The method may further include comparing a value of the indicated property with a set point and indicating an alarm condition, as well as, servicing or resetting the superconducting magnet system, and/or outputting a voltage control signal.

Additionally, with the technique, a superconducting magnet system may include a cryogen vessel disposed in the superconducting magnet system and holding a cryogen for cooling one or more magnets, a scalable analog-to-digital converter with integrated excitation circuitry that provides an excitation current to a sensor disposed in the superconducting magnet system and that reads an analog signal from the sensor, a magnet selector interface for scaling the analog-to-digital converter and integrated excitation circuitry based on the particular sensor and on the particular superconducting magnet system being monitored, control and monitoring circuitry and a communications module for processing and sending data to a remote host system and for receiving and processing data from the remote host system, and a power supply for supplying power to analog-to-digital converter and the integrated excitation circuitry. The system may also include a cold head configured for removing heat from the superconducting magnet and condensing cryogen vapor received from a vapor space of the cryogen vessel, a refrigerant compressor system that supplies refrigerant to the cold head to cool the cold head, a heater for vaporizing cryogen liquid and controlling pressure in the cryogen vessel, and a relief vent disposed in the superconducting magnet system for relieving cryogen from the cryogen vessel. Moreover, the superconducting magnet system may be disposed within a magnetic resonance (MR) imaging system.

Furthermore, in accordance with the present technique, a computer program, provided on one or more tangible media, for operating a superconducting magnet system, may include a routine for determining a magnet system type and associated sensor types of the superconducting magnet system, a routine for selecting magnet settings for the monitoring system, such settings generally corresponding to the determined magnet type and determined sensor types, and including one or more scaling factors for analog-to-digital conversion, a routine for programming the monitoring system in accordance with the selected magnet settings, and a routine for remotely monitoring the superconducting magnet system. The computer program may include a routine for providing an analog signal from a sensor disposed in the superconducting magnet system, such analog signal indicative of a property of the superconducting magnet system, and a routine for scaling an analog-to-digital conversion of the analog signal based on the one or more scaling factors. Additionally, the program may include a routine for scaling an excitation current for input to the sensor based on the magnet settings. The computer program may also include a routine for comparing a value of the indicated property with a set point and indicating an alarm condition, as well as, outputting a voltage control signal.

DETAILED DESCRIPTION OF SPECIFIC EMBODIMENTS

Figure 1:
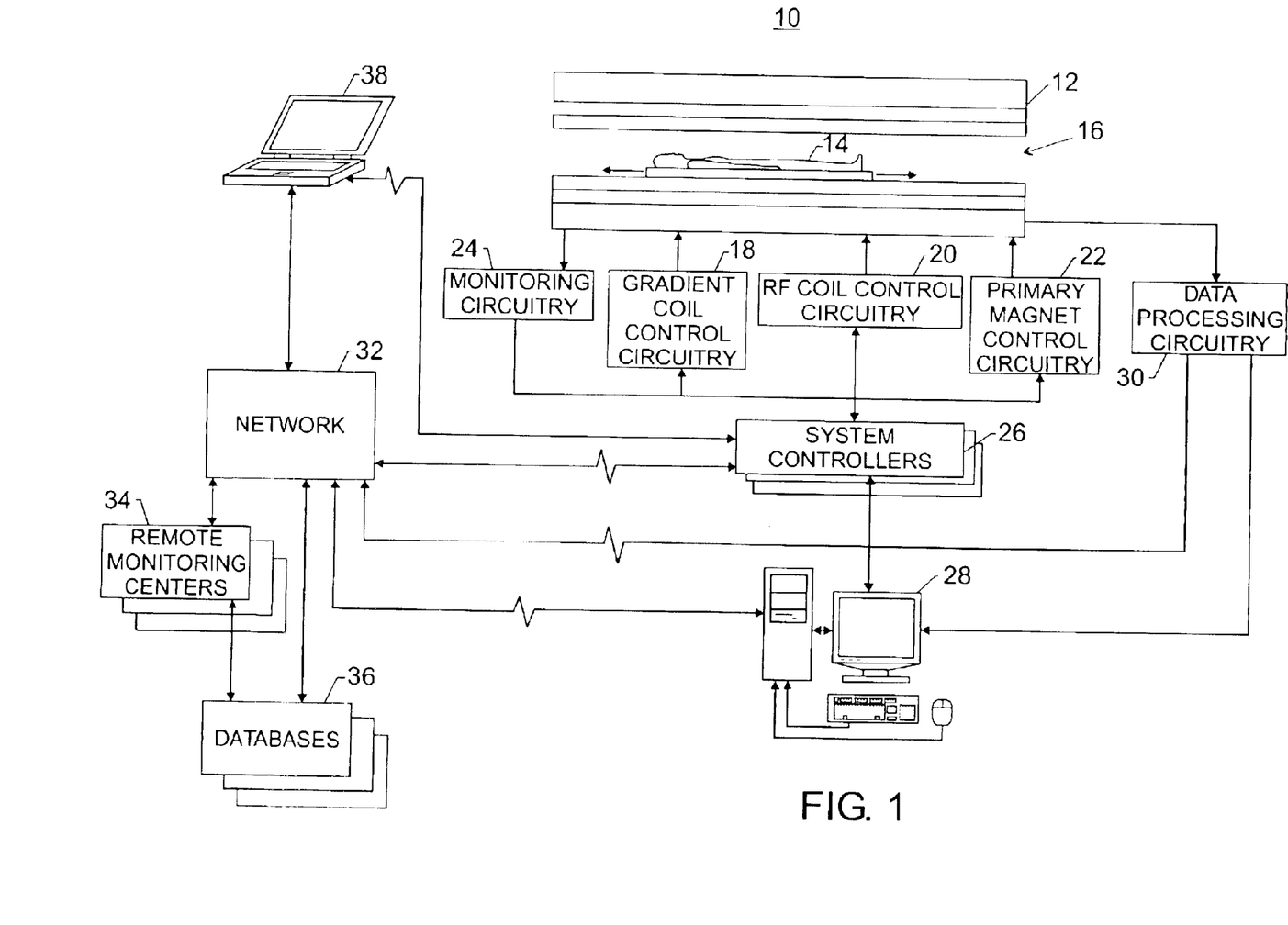
FIG. 1 is a diagrammatical representation of an exemplary imaging network having features in accordance with the present technique.

Turning to the drawings, and referring first to FIG. 1, an exemplary imaging network 10 is illustrated. Although the present technique is described with respect to a medical imaging device, it should be note that the present technique may be applied to any number of systems or devices that employ a cryogen cooling system, such as spectroscopy systems, nuclear accelerators, biological cooling facilities, and power transmission systems, to name but a few. The exemplary imaging network 10 includes a magnetic resonance imaging scanner 12.

To obtain diagnostic images of a patient 14, a medical professional may direct the patient 14 into a patient bore 16 of the MRI scanner 12. A main magnetic field (e.g., 0.5–2.0 Tesla) is generally present in the patient bore 16. This field, as discussed further below, is produced by a superconductive electromagnet (see FIG. 2) disposed circumferentially about the patient bore 16. The superconductive electromagnet is maintained at superconducting temperatures (e.g., 1–5 degrees Kelvin) to reduce the electrical resistance in the magnet coils to substantially zero. Advantageously, the superconductive nature of the electromagnet reduces the electrical requirements for producing the magnetic field, thereby making the MRI scanner 12 more economical to operate. Additionally, to manipulate the main magnetic field and to obtain diagnostic images, the MRI scanner 12 includes gradient magnets or coils, and radio frequency (RF) coils (not shown), both of which may be of generally known construction.

Operation of the MRI scanner 12 may be controlled and/or monitored by any number of control and monitoring circuits. By way of example, the gradient coils, the RF coils, and the main magnet may be controlled by gradient coil control circuitry 18, RF coil control circuitry 20, and main magnet control circuitry 22, respectively. Moreover, as discussed further below, various operations and conditions of the MRI scanner 12 may be monitored by monitoring circuitry 24.

Certain of these control and monitoring circuits may function under the direction of one or more system controllers 26, such as the heater controller and cooling system controller discussed further below. The system controller may include any suitable programmable logic device, such as a CPU or a digital signal processor of a general purpose or application. The system controller also may include memory circuitry, such as volatile and non-volatile memory devices, for storing physical and logical axis configuration parameters, examination pulse sequence descriptions, acquired image data, programming routines, and so forth, used during the examination sequences implemented by the scanner. Advantageously, the system controllers 26 may permit some amount of adaptation or configuration of the examination sequence by means of an operator interface 28. The operator interface 28 may be a computer terminal that provides a graphical user interface (GUI) to an individual for the receipt of information from and the input of commands to the MRI scanner 12.

Additionally, the MRI scanner 12 may be coupled to data processing circuitry 30, which receives the detected imaging signals and processes the signals to obtain data for image reconstruction. In typical MRI scanners 12, the data processing circuitry 30 digitizes the received signals and performs a two-dimensional fast Fourier transform on the signals to decode specific locations in the selected slice from which the received signals originated, thereby producing image data representative of the patient's internal tissue and organs, or more generally, features of interest of a subject. The resulting image data may be forwarded to the operator interface 28 for viewing. The image data may also be sent to a remote data repository for storage, as discussed further below. Advantageously, the data processing circuitry 30 may perform a wide range of other functions, such as image enhancement, dynamic range adjustment, intensity adjustment, smoothing, sharpening, and so forth. However, it should be appreciated that such functions may also be performed by software and/or hardware included in the operator interface 28 as well as at remote locations, which are discussed further below.

In many instances, the MRI scanner 12 may communicate with remote locations and devices via a network 32, such as a Local Area Network (LAN), a Server Area Network (SAN), a Metropolitan Area Network (MAN), a Wide Area Network (WAN), a Virtual Private Network (VPN), the Internet, or any other suitable kind of network. Communications over the network 32 may be conducted via any number of communications schemes and protocols, such as Global Standard for Mobile (GSM), Time Division for Multiple Access (TDMA), Code Division Multiple Access (CDMA), Frequency Division Multiple Access (FDMA), radio frequencies (RF), or any other suitable communications techniques. By way of example, the imaging network 10 may include remote monitoring centers 34, which may receive operation data and imaging data from the MRI scanner 12 via the network 32. Advantageously, the remote monitoring centers 34, via the network 32, may improve the image data quality as well as monitor and adjust the operating parameters remotely.

The network 32 may also facilitate access to remote databases 36. Advantageously, the remote databases 36 may store large volumes of image data and operating data from a wide variety of sources coupled to the network. That is, data from multiple MRI scanners 12 and patients 14 may be stored in a central location. Indeed, image or operating data may be accessed by user interfaces 28 at locations remote from the imaging scanner 12.

In certain instances, a field technician may wish to access data or operating parameters from the MRI scanner 12. Accordingly, a field unit 38, such as a laptop computer or hand-held device, may be linked to the system controllers 26. To improve portability, the field unit 38 may be configured to communicate with the system controllers 26 via a wireless protocol, such as IEEE 802.11(b), Bluetooth, or RF communications. Advantageously, the field technician, via the field unit 38, may be able to monitor operations of the MRI scanner 12 and provide system adjustments in response, to improve the quality of the images produced. Of course, the field unit 38 may also communicate with the imaging scanner 12 via the network 32.

Figure 2:
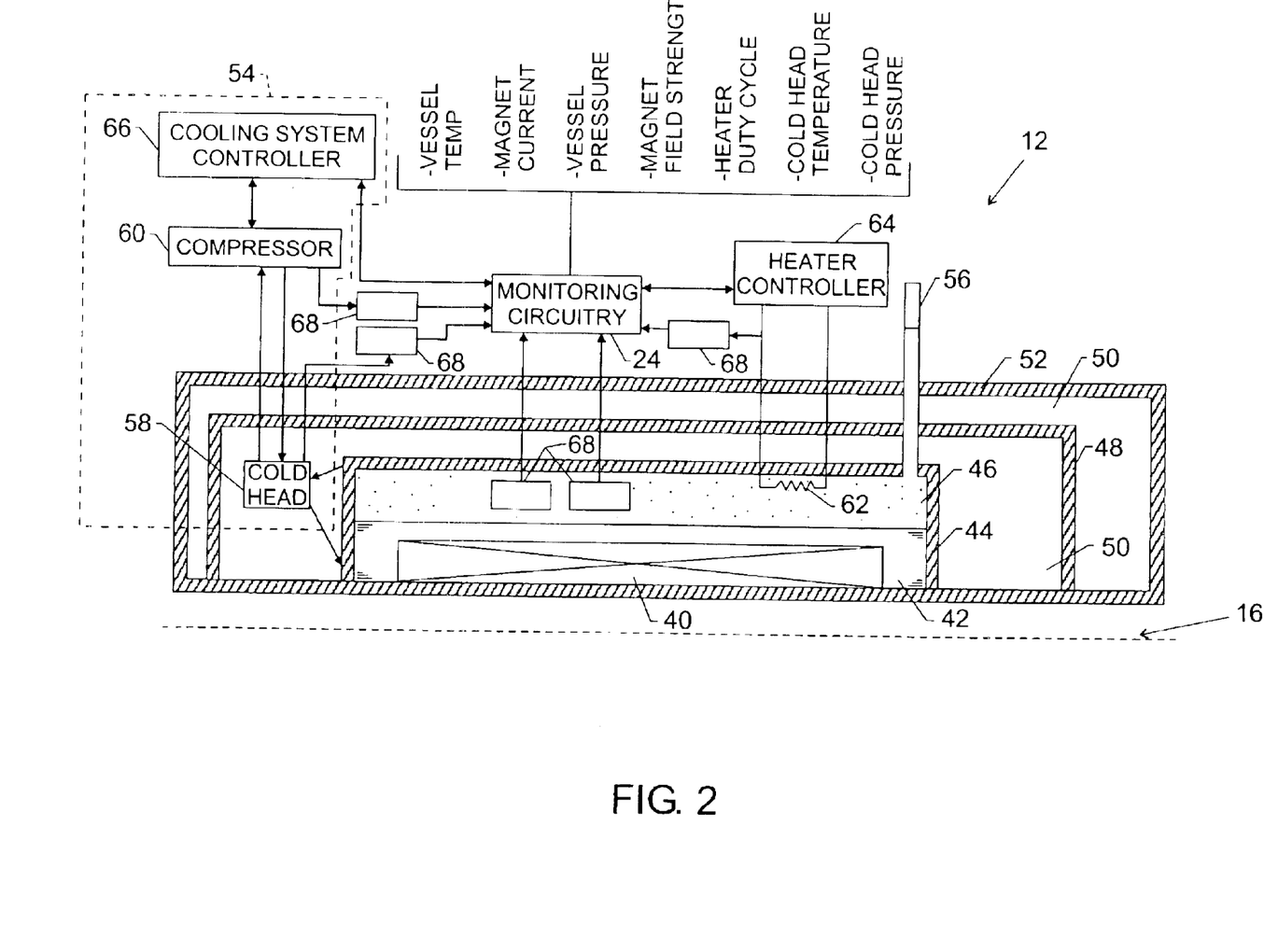
FIG. 2 is a partial cross-sectional view of an exemplary imaging device having features in accordance with the present technique.

Turning to FIG. 2, a partial cross-sectional view of an MRI scanner 12 is presented. As discussed above, the MRI scanner 12 maintains a main magnetic field of approximately 0.5 to 2.0 Tesla in the patient bore 16. To produce the main magnetic field, the exemplary MRI scanner 12 includes a magnet 40 located towards the center of the MRI scanner 12 and disposed circumferentially about the patient bore 16. The main magnet is an electromagnet formed of loops of coiled wire. Routing electrical current through the coiled wire produces a magnetic field. To reduce the electrical load necessary to produce the desired main magnetic field, the exemplary electromagnet may be cooled to a superconductive state. It should be noted that only an upper portion (i.e., above the centerline) of the exemplary, tubular MRI scanner 12 is illustrated in FIG. 2. Because of the tubular design, the lower portion is similar to the upper portion, and, as such, the lower portion is not separately discussed.

It should also be noted that, although a tubular scanner structure is described here, other geometries of magnets are known and presently in use, and can benefit from aspect of the present technique. For example, split imaging systems are known, in which an imaging volume is defined between two separated magnet sections. The sections are typically positioned either one above the other, or in a side-by-side arrangement. In either case, however, the superconductive magnet is cooled by a cryogenic system that may be maintained and serviced as described below.

To transition the electromagnet to a superconductive state, the electromagnet 40 may bathed in a cryogen, such as liquid helium 42, contained in a helium vessel 44, which circumscribes the patient bore 16 and surrounds the electromagnet 40. The liquid helium cools the electromagnet to superconductive temperatures (e.g., −269° C. or 4 K). At superconductive temperatures, the electromagnet 40 (i.e., the loops of coiled wire) conducts electrical current essentially free of electrical resistance. Of course, the particular temperature at which the magnet materials transition to a superconducting state may vary depending upon the material used, and the specific temperature is not a limitation of the present technique. Advantageously, a relatively strong magnetic field (0.5–2.0 Tesla) may be produced at lesser electrical loads in comparison to traditional magnets, thereby reducing the operating costs of producing and maintaining the magnetic field. Other field strengths are, of course, possible, with spectroscopy and other systems obtaining significantly higher flux densities.

Liquid helium 42, similar to other cryogens, vaporizes into a gaseous state, such as gaseous helium or helium vapor 46, at relatively low temperatures (e.g., liquid helium boils at 4.2 K under standard pressure conditions). Accordingly, to insulate the helium 42 and 46 from external heat sources, the helium vessel 44 may be surrounded by a radiation heat shield 48. Advantageously, a vacuum region 50 is located between the helium vessel 44 and the heat shield 48, as well as between the heat shield 48 and an outer housing 52 of the MRI scanner 12 to further insulate the helium vessel 44 and magnet 40 from external heat sources.

Furthermore, as also discussed further below, the vaporization of the liquid helium 42 typically increases the pressure in the helium vessel 44. Accordingly, the helium vessel 44 may be coupled to a vent or relief valve 56. In a present embodiment, for example, if pressure in the helium vessel 44 exceeds a desired operating pressure (e.g., 4 psig) and reaches a relieving set point (e.g., 4.5 psig), the vent may release excess helium 46 to relieve the pressure. However, because helium is relatively expensive, the venting of the helium is to be avoided.

To conserve helium, the helium vessel 44 is coupled to a cryogen condensing system 54 (also called cryo-cooler or cryo-condenser), which recondenses gaseous helium 46 back into its liquid phase 42. In the exemplary MRI scanner 12, the cryogen condensing system 54 includes a cold head 58 coupled to a compressor 60 (e.g., a two stage compressor with the second stage cooling the cold head 58). As appreciated by those skilled in the art, the compressor 60 pressurizes a coolant, such as liquid nitrogen, and circulates the coolant to the cold head 58. By allowing the coolant to decrease in pressure, fins (not shown) in the cold head 58 may be cooled to the condensation point of the cryogen, that is, a low enough to cause the helium vapor 46, for example, to return to its liquid phase. In a cyclical manner, the helium vapor 46 (gaseous helium) is routed from the vessel (i.e., rises from the vessel) to the cold head 58 and across the fins. The fins, which are cooled to approximately 2–4 K, provide heat transfer surface area and condense the helium vapor back into its liquid phase. The recondensed liquid helium 42 is routed (i.e., by gravity) back into the helium vessel 44, thereby conserving the helium in the vessel 44 and producing an equilibrium between the liquid and gaseous phases of the helium.

During operation of the MRI scanner 12, it may be advantageous to maintain the pressure within the helium vessel 44 within predetermined parameters, e.g., 4.0 to 4.5 psig. However, if, for example, the equilibrium in the helium vessel 44 is biased towards the liquid phase of the helium by the cold head 58, the helium vessel 44 may reach a negative pressure condition allowing atmospheric gases to be drawn into the vessel 44. If atmospheric gases enter the helium vessel 44, water vapor in the atmosphere may freeze, causing clogs in the cooling system that degrade the performance and, in certain instances, leading to failure of the cooling system 54 and/or the MRI scanner 12. Thus, to increase the pressure and prevent a vacuum, a heating element 62, such as a resistive heating element, is located in the helium vessel 44. The heater typically maintains a positive pressure condition, such as a pressure greater than that of the environment (i.e., greater than approximately 0 psig or 14.7 psia). As discussed further below, while the cold head, in general, operates continuously, power to the heating element 62 cycles to maintain an equilibrium within the vessel. In a present embodiment, power to the heating element is controlled in a closed-loop manner based upon pressure detected within the vessel, to maintain the pressure between desired minimum and maximum levels, and thus to maintain the desired temperature.

Alternatively, if, for example, the equilibrium is biased towards the gaseous phase by the cold head operating inefficiently or external heat sources, the pressure in the vessel 44 may increase, along with a potential increase in the temperature of the helium, leading to an undesired venting of helium and/or degradation in image quality. As discussed further below, if a high-pressure condition is detected, a condensing system controller 66 may optimize and adjust operations of the condensing system 54 to bias the equilibrium of the helium towards the liquid phase, thereby reducing the pressure in the vessel 44.

To monitor operation of the MRI scanner 12, a plurality of sensors 68 may be located throughout the MRI scanner 12, and particularly on or in the main magnet structures and support systems. For example, sensors for measuring cryogen temperature, pressure, and level may be located in the helium vessel 44 and are collectively indicated generally by reference numeral 68. Other sensors 68 may monitor shield temperatures, the magnet field strength and frequency (i.e., with a Tesla meter probe inserted into the magnet bore), magnet current, and operating variables of the condensing system 54, such as operating pressure and temperature of the cold head 58 and the compressor 60. Yet other sensors 68 may monitor the pressure control circuit and heating system, such as operation of the heater controller and heating element 62. Of course, there may be any number of sensors 68 located throughout the MRI scanner 12 for monitoring any number of conditions.

In general, sensors and their associated circuits may be used to measure various physical properties such as temperature, pressure, frequency, etc. Sensor output may be conditioned and processed to provide corresponding measurement of the physical property. Sensors are typically part of a larger system including, for example, various analog or digital signal processing circuits. Such systems may be a measurement system, data acquisition system, or process control system, and so forth. In general, sensors may be classified as "active," requiring an external source of excitation, or "passive" (i.e., self-generating), generating their own electrical output signal without requiring external voltages or currents. Examples of active sensors are resistor-based sensors such as thermistors, resistance temperature detectors (RTDs), and strain gages. Typically, a current must be passed through active sensors and the corresponding voltage measured in order to determine the resistance value. An alternative is to place the devices in a bridge circuit, however in either case, an external current or voltage is required. On the other hand, passive sensors do not require external circuits and include, for example, thermocouples and photodiodes which independently generate thermoelectric voltages and photocurrents, respectively. Moreover, sensors which measure different properties may have the same general type of electrical output.

The various sensors 68 throughout the magnet system may provide operational data regarding the MRI scanner 12 to monitoring circuitry 24. Moreover, the heater controller and the cooling system controller, and in general, components of a pressure control circuit, may also provide data to the monitoring circuitry 24. By way of example, the monitoring circuitry 24 may receive and process data regarding the temperature within the vessel, the pressure within the vessel, the heater duty cycle, coolant (refrigerant) pressure within the condensing/compressor system, or a host of any other operating conditions regarding the MRI scanner. Advantageously, the monitoring circuitry may be configured to communicate the processed and received information to the network 32 as well as to the user interface 28 (see FIG. 1).

In general, operating conditions may be examined to control and maintain magnet temperatures and superconductivity, to evaluate magnet performance and MRI system performance, to decide service intervals, and so forth. The monitoring of magnet system variables in accordance with the present technique may accommodate advanced notification of cryogen system behavior, such as changes in the pressure-temperature equilibrium, as well as, changes in performance of system components (e.g., cold head, heater, thermal insulation, and so forth). Ultimately, undesirable performance of such components, may adversely affect the magnet temperature and superconductivity, as well as, increase helium boil-off. Furthermore, excessive heat transfer from the environment may also have similar negative effects on magnet system operation.

Moreover, the present technique may better detect problems with the insulation of the magnet system. Again, the magnet and cryogen configuration may be insulated, for example, with insulating material and vacuum regions to deter heat transfer from the environment to the magnet and cryogen. Indeed, absent insulation or other heat transfer barrier, significant heat transfer may occur because of the low operating temperature of the magnet and cryogen relative to ambient temperatures, resulting in increased helium boil-off and servicing to refill the system with helium. Furthermore, with excessive environmental heat effects, the temperature may increase and superconductivity may be lost, resulting in poor image quality, system downtime, possible equipment damage, and so forth. However, the monitoring of primary and secondary indicators previously discussed, and early notification (i.e., to a service technician) may permit repair of such problems or other problem prior to manifestation of significant operational problems. Typical advance observations that may be indicative of an insulation problem and/or excessive heat transfer from the environment include, for example, increases in pressure and temperature, decreases in heater duty cycle, and decreases in helium level.

Figure 3:
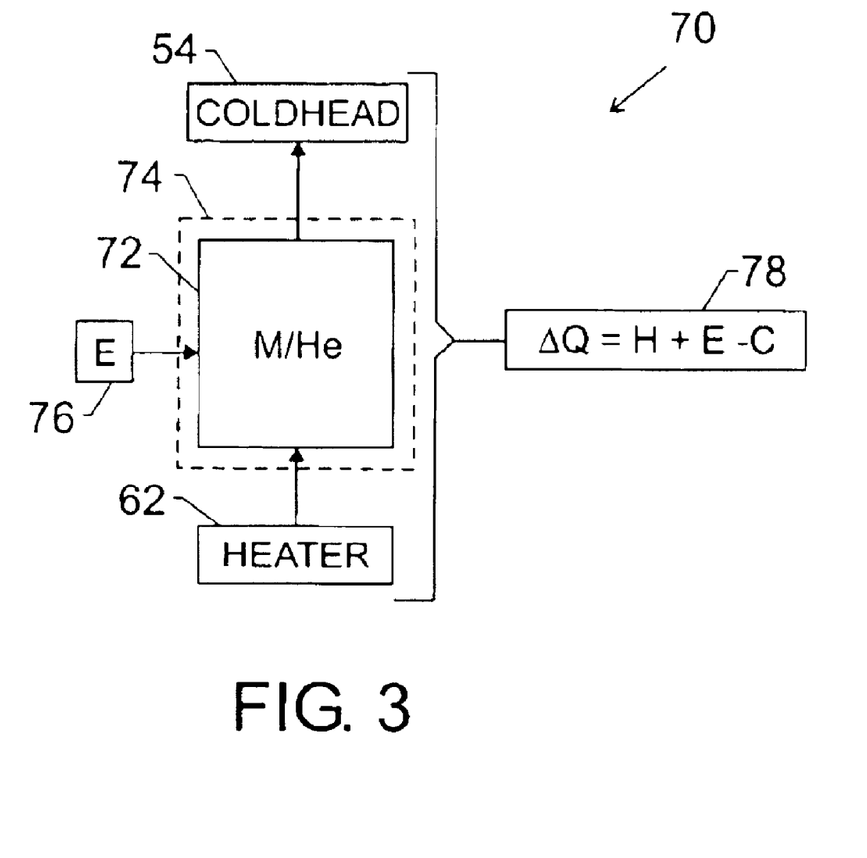
FIG. 3 is a graphical representation of an energy balance of a recondensing superconducting magnet system.

FIG. 3 is a graphical representation of an energy balance 70 of a recondensing superconducting magnet system. In particular, FIG. 3 graphically illustrates an energy balance 70 of the ideally closed system 72 of the magnet 40 and surrounding helium 42 and 46 depicted in FIG. 2. A theoretical heat transfer boundary 74 is denoted by a dashed line. The heater 62 adds heat to the system 72 and the cold head 54 removes heat from the system 72. Additionally, because the system 72 may operate at temperatures lower than ambient, heat transfer may also occur from the environment 76 to the system 72. In sum, the change in heat, $\Delta Q$, equals the heat, H, added by the heater plus the heat, E, added by the environment minus the heat, C, removed by the cold head (equation 78).

Undesirable boil-off is often related to the heating and cooling equilibrium required for proper operation of conventional and recondensing thermal systems. There may be a multitude of variables that contribute to an imbalance in this equilibrium resulting in non-zero boil-off operation of the recondensing thermal systems. Such variables may include, for example, degrading cooling capacity of the cold head (cryo-cooler machine) over its operation life, plumbing leaks in the pressure system that violate the closed system requirement, and environmental effects such as facility issues preventing optimal cold head (cryo-cooler system) functionality. The technique provides earlier possible identification of failures related to such variables, as well as, helps isolate the nature or root cause of the problem. The technique, in general, provides for monitoring of magnet system variables, including primary and secondary indicators previously discussed, to advance predictive maintenance and reduce costs.

As previously discussed, MRI equipment may require a liquid cryogen, such as liquid helium, to maintain cryogenic temperatures for superconductivity. Liquid helium is highly unstable and shifts phase to gas very readily with any added heat load on the cryogenic cooling circuit. When liquid helium undergoes this phase change, the magnet pressure increases and if the pressure exceeds the safety relief valve pressure setting, helium gas escapes until the pressure has returned to a level below the relief valve pressure setting. This loss of liquid helium is termed "boil off", which represents a risk for the magnet. As boil off continues to progress, the liquid helium level continues to decline, and if this condition goes uncorrected, the magnet may warm sufficiently to lose superconductivity and the magnetic field may collapse, thus rendering the magnet and MRI at least temporarily out of service. Repair of the magnet may require considerable downtime, materials, service labor, and costs. A response, according to the present technique, is to collect data from sensors installed in the magnet system to indicate the condition of the magnet and to provide data for proactively maintaining the liquid helium as a liquid. Primary indications of liquid helium phase shifting to gas from a liquid include, for example, level of the liquid helium and pressure of the helium vapor in the magnet (helium) vessel 44. Secondary indications may include signs of peripheral system malfunctions, such as failure of the compressor, cold head, power, heater, and so forth. Often, in conventional systems, such primary and secondary indications and other useful indications, such as heater duty cycle, magnet current, magnet field strength, and so forth, go unnoticed because the equipment user is unaware of the situation.

The present technique may utilize remote terminal units (RTU's) and similar off-the-shelf (OTS) data logging technology adapted or customized to sample and log both the primary and secondary indications of boil off. The RTU or OTS solution may be adapted for the application of monitoring a magnet and utilizing magnet sensors, such as a cryogenic level sensor, a helium pressure transducer, helium and shield temperature sensors (e.g., resistance temperature detectors), a current sensor, and so forth. Excitation circuitry may be integrated within the RTU and the unit may thus have provisions to scale the input to the sensors, as well as to scale the output from the magnet sensors. The unit may be scalable to the exact input and output requirements of the specific magnet type. The scalability of the unit may enable application of the unit to almost every magnet, regardless of manufacturer or vintage. The unit may employ industry standard communication protocols, such as Modbus, HART, Rackbus, and the like, communicating with magnet sensors and an on-line service center. Connectivity options to an on-line service center may include modem, Ethernet, broadband, virtual private network (VPN), fiber optic link, radio, RS485, RS232 or any other suitable protocol. The adapted RTU may be programmed to sample all sensors on a timed basis and to report the data to the on-line service center via such connectivity options. The exemplary customized RTU may have the capability to compare data values against set point values, and once set point values are exceeded, the RTU may create an alarm condition and call out to the service center. In addition to data logging, the RTU may have the capability to output voltage control signals, which may trigger, for example, system reset circuits which may also be initiated by the remote service center. As opposed to traditional techniques, moreover, the present technique permits a number of variables and inputs to be considered together or in combinations that permit improved forecasting of system conditions and developing needs for servicing.

In sum, the present technique provides for incorporation of RTU's and other off-the-shelf technologies in magnet tracking and controls. The technique may integrate excitation circuits, as well as, scale any excitation supplied to the sensors and resultant analog voltage or current feedback received from the sensors. This application may be adapted to MR magnets, scalable for most magnet types and vintages. The RTU devices may enable an on-line service center to monitor the primary and secondary indications of boil off for the magnet, as well as other magnet and cooling system conditions. With these indications, a field service engineer, for example, may be aware of the boil off and thus may service the magnet in a more timely manner to prevent the magnet from losing superconductivity. The remote ability to trigger control voltages may allow the magnet to be serviced by the remote service center. Finally, it should be apparent that the present technique may be targeted to forward manufacturing, as well as, to the servicing and retrofitting of existing MRI units in the field.

To discuss the technique in greater detail, an exemplary application for monitoring of the cryogen temperature and radiation shield temperature is examined. Typically, resistance temperature detectors (RTD's) are used to measure magnet system temperatures. One challenge in servicing various types of imaging systems and magnet designs is that the model and type of RTD may differ, depending on the manufacturer of the MRI and magnet system, as well as on the vintage of the system. A particular issue is that different types and models of RTD's may require different magnitude excitation currents, as well as different analog-to-digital scaling requirements to read the RTD output. Furthermore, different RTD's employ different coefficients to convert the change in voltage read across the RTD to a change in the measured temperature. Accordingly, the present technique provides for selecting the appropriate parameters required for operation of the specific RTD.

As will be appreciated by those skilled in the art, an RTD is a device that senses temperature by measuring the change in resistance of a material. In general, the resistance of the temperature sensing device increases with temperature. A RTD may consist of a wire coil or a deposited film of pure metal. RTD's can be made of different metals, but the most popular RTD metal is platinum with nominal resistance values of about 100 ohms at zero degrees Celsius. The actual resistance values may depend, for example, on the purity of the platinum. RTD's come in many forms, but usually appear in sheathed form. An RTD probe is typically an assembly composed of a resistance element, a sheath, lead wire and a termination or connection. The sheath, a closed end tube, immobilizes the element, protecting it against the process environment to be measured. The sheath also provides protection and stability to the transition lead wires from the fragile element wires. Some RTD probes can be combined with a thermowell for additional protection. For the resistance element, several metals, such as platinum, nickel, and copper, may be used, with the purity of the metal affecting its resistive characteristics. Platinum is the most widely used resistance metal due to its linearity with temperature. The temperature coefficient of an element is a physical and electrical property of the material that describes the average normalized resistance change (ohms/ohm) per unit of temperature from 0° C. to 100° C.

Various organizations have adopted different temperature coefficients as their standard. As will appreciated by those skilled in the art, most platinum RTD curves follow one of three standardized curves: the DIN 43760 standard ($\alpha$=0.00385 ohms/ohms/° C.); the U.S. Industrial or American standard ($\alpha$=0.00391); or the International Temperature Scale (ITS-90) that is used with wire-wound RTD's ($\alpha$=0.003925). Each one of these three platinum RTD standards (curves) will generally have different Callendar-Van Dusen coefficients. Other RTD's not employing one of the three standard listed above may also incorporate differing coefficients.

Although the resistance-temperature curve is relatively linear, accurately converting measured resistance to temperature requires curve fitting. The Callendaf-Van Dusen equation is commonly used to approximate the RTD curve: $t=R_0[1+At+Bt+C(1-100)^3]$, where $R_t$ is the resistance of the RTD at 0° C., and A, B, and C are the Callendar-Van Dusen coefficients, and t is the temperature in ° C. For a known current passing through the RTD and a corresponding measured output voltage developed across the RTD, the sensed temperature may be solved as a function of the excitation current, measured voltage, RTD resistance (at 0° C.), and the Callendar-Van Dusen coefficients. It should be noted that each RTD type generally requires a specified magnitude or range of excitation current, for example, in amps or microamps. A particularly power aspect of the present technique is the universality of the magnet monitoring system, providing for selectable magnet profiles that define the magnet type and associated settings, such as settings of the Callendar-Van Dusen coefficients, as well as scaling factors for the excitation current, for a specific RTD sensor in the magnet system.

Moreover, the measuring (direct) current undesirably generates heat in the RTD. Because an RTD is a passive resistive device, however, a current must pass through the device to produce a measurable voltage, but this current also causes the RTD to internally heat, which appears as a reading error. Self heating may be reduced by using smaller excitation currents. Additionally, any resistance in the lead wires that connect the measurement system to the RTD may add error because a lead wire used between the resistance element and the measuring instrument has a resistance itself. Accordingly, the measuring system typically compensates for reading error introduced by the resistance in the lead wires, as well as, that introduced by self-heating. Similarly, as will be appreciated by those skilled in the art, the lead wires may be configured as 3-wire or 4-wire leads, instead of 2-wire leads, to account for lead wire resistance. The present technique accommodates the selection of settings of the appropriate error compensation factors and configurations for the specific sensor in the particular magnet system, such sensors including RTD's (e.g., that measure cryogen temperature or shield temperature) and other devices. A universal package provides for monitoring temperature, for example, in magnet systems with different type RTD's with different coefficients, excitation requirements, self-heating factors, and lead-wire configurations.

The present technique provides for designing a custom analog-to-digital circuit integrated with scalable excitation circuitry to provide the required excitation current to the target magnet RTD and the required A/D scalability (and required reading accuracy) that meets or exceeds the original equipment manufacturer (OEM) abilities. The technique addresses servicing needs of magnet systems manufactured by a variety of manufacturers including different vintages, and advancing a universal cryogen shield temperature measurement and/or universal cryogen temperature measurement. The accurate, remote monitoring and history of shield temperature performance and cryogen temperature facilitates predictive service and preemptive failure analysis without the need for on-site presence by a field engineer. The technique may be implemented in the original manufacture of the equipment, in servicing scenarios, and so forth. Additionally, the scalable A/D and excitation circuitry for a given RTD and other sensors may be mounted near or inside an RTU.

Figure 4:
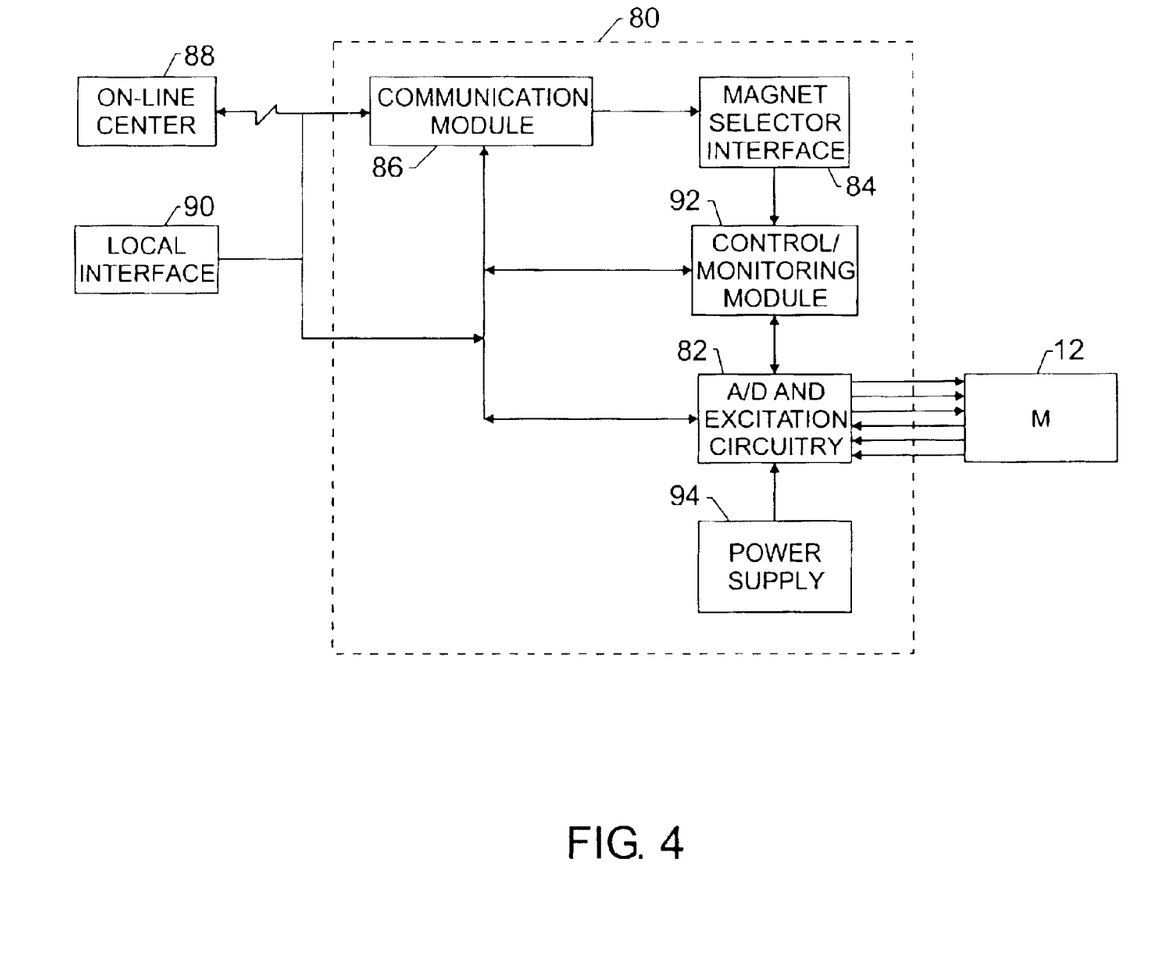
FIG. 4 is a diagrammatical representation of a monitoring system of a recondensing superconducting magnet system.

FIG. 4 is a diagrammatical representation of a monitoring system 80 of a recondensing superconducting magnet system 12. The monitoring system 80 may comprise, for example, an RTU package. Such a package may include, for example, an enclosure, power supply, pluggable termination points, a central processing unit, communication subsystems, analog and digital input/output circuitry, and so forth. The RTU may be constructed having a motherboard with connectors for input/output (I/O) modules, as well as, other features such as a timer, real-time clock, a built-in software library, data scanning routines, database management, and so forth. In general, an RTU may be designed to be supported by a full-range of I/O interfaces and through these interfaces the RTU may connect to various types of signals encountered in the field. An RTU may be able to interface to host systems using a variety of industry protocols (i.e., communication system protocols such as Modbus).

A scalable analog-to-digital (A/D) conversion interface for an A/D converter with integrated excitation circuitry is denoted by reference numeral 82. Scaling factors may be set via the magnet selector interface 84. In other words, the magnet selector interface 84 may provide for selecting the settings of the monitoring system 80 to correspond to the particular magnet being monitored, and thus provides scaling factors for the analog-to-digital conversion interface 82 and any excitation current that may be required. Moreover, the A/D conversion interface 82 and the communication module 86 may have a variety of I/O interfaces and A/D conversions. The A/D conversion interface 82 may excite and receive signals from a variety of sensors in the magnet system 12. It should be noted that for some sensors, such as passive-type sensors, excitation current may not be necessary.

A variety of I/O in the RTU package may include, for example, optically isolated digital inputs, differentially selected analog inputs, similar outputs, and so forth. The type and number of inputs and outputs may be modified as necessary, and also, the communication module 86 may include serial ports. An on-line service center 88 (i.e., remote center) may communicate with the monitoring system 80 via the communication module 86 in a variety of protocols, such as Modbus. The on-line service center 88 or other host system may communicate with the RTU, for example, via RS-232, RS-485, radio, modem, fiber optic link and the like. It should also be noted that a local interface 90, such as a laptop, may be connected locally to the communication module 86, for example, to serial ports embedded within the control/monitoring module 92 or on the A/D 82. Such a local interface 90 may be used, for example, for local control, diagnostic testing of the monitoring system 80, and so forth. Additionally, the magnet selector interface 84 may also have local capability for a user to select the magnet settings and profile. On the other hand, the on-line service center 88 (which may generally correspond to one or more of the network 32, remote monitoring centers 34, and databases 36 illustrated in FIG. 1) may download one or more flags to choose the magnet selection. The on-line service center 88 may first detect the type of magnet system to determine the appropriate magnet profile.

A variety of control and monitoring circuitry may be included in the control/monitoring module 92, which may include, for example, various central processing units, microprocessors, programmable logic controllers (PLC), micro PLC's, and the like. The circuitry may be programmed via conventional ladder logic or other programming languages. The module 92 circuitry may incorporate and/or compliment the monitoring circuitry 24 of FIG. 1 and FIG. 2. The circuitry may also include peripherals, for example, that performs onboard I/O functions, as well as provides memory, such as random access memory (RAM) and programmable read-only memory (PROM). Additionally, as will be appreciated by those skilled in the art, a boot system may be resident in PROM memory of the peripherals, for example. Furthermore, within the control/monitoring module 92, program memory may be stored in flash memory allowing, for example, field upgrades of firmware through the communication channels. Moreover, a database may be stored in some systems in non-volatile RAM, and scratch data, tables, and stacks may be stored in RAM.

Furthermore, an RTU firmware may be implemented, for example, using flash RAM technology. The firmware may be updated, for example, via a host communications interface, such as via the on-line center 88 and communication module 86. This capability allows, for example, for downloading of new features. A database manager may collect programs and data, and allow the RTU system to access data from the database in a program-independent manner, with the database manage residing in non-volatile RAM, for example. The database manager may also contain a database dictionary which describes how the database is organized.

Within the monitoring system 80, a power supply 94, for example, may convert 120 volt AC or 240 volt AC to 24 volt DC for supply to the A/D 82 for the excitation circuitry and other devices. The power supply 94 may supply power to other components within monitoring system 80, as well as, components and sensors external to system 80.

Figure 5:
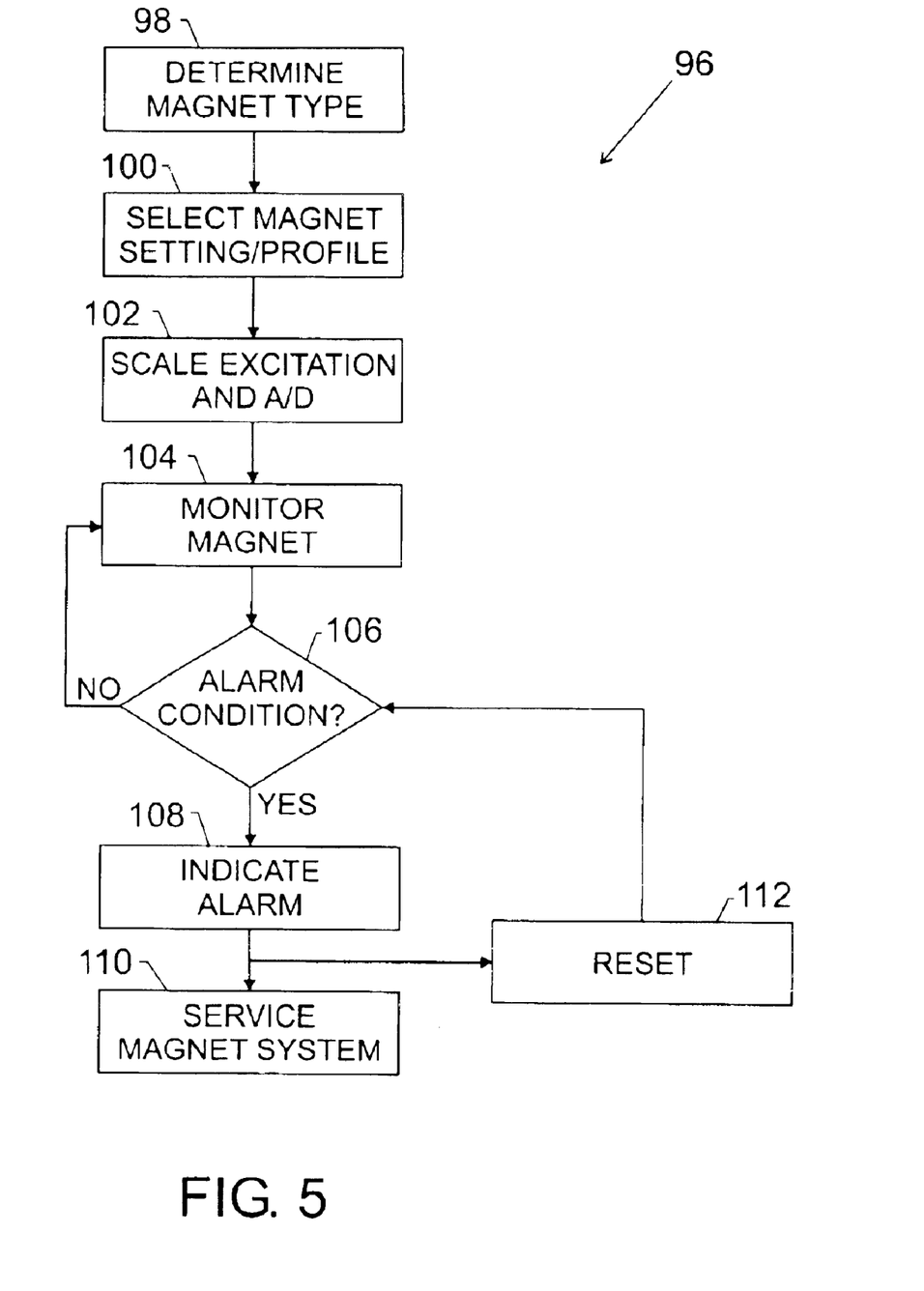
FIG. 5 is a block diagram of a monitoring method of a recondensing superconducting magnet system.

FIG. 5 is a block diagram of a monitoring method 96 of a recondensing superconducting magnet system 12 (FIG. 1 & FIG. 2). A remote on-line center, onsite field engineer, or other entity may determine the magnet system type by detecting the particular system of interest (block 98). Based on the determined magnet type, the magnet settings and profile may be selected remotely by the on-line center or locally by the field engineer (block 100). Selection of the magnet profile may configure the monitoring system for the particular magnet system of interest. For example, based on the magnet settings, the excitation current and analog-to-digital conversion for the various sensors may be scaled to match the particular sensors on the magnet system (block 102). Some sensors such as passive sensors (e.g., thermocouples) within the magnet system 12 may not require an excitation current.

Once the system and associated circuitry has been configured for the particular magnet system 12 and scaled accordingly, the system may then monitor the magnet system (block 104). The system may continue to monitor the magnet system 12 and if an alarm condition is reached (block 106), the alarm condition may be indicated (block 108). Such indication may take a variety of forms, such as a local audible alarm, local light, remote alarm at the on-line service center, e-mail or pager message to a service technician, and so forth. Upon indication of an alarm condition, a field engineer, service technician, and the like may service the magnet system (block 110) based on the indicated data. In accordance with the present technique, such service may advantageously be in advance of liquid helium boil off, equipment damage, and the like, because in part, the technique improves predictive maintenance and facilitates scheduling of maintenance intervals, Ultimately, the technique reduces maintenance costs and down time. It should be noted that the monitoring method 96 may also provide for the capability to output voltage control signals (block 112). For example, controls may be applied to trigger system reset circuits and/or the reset circuits may be initiated by the remote on-line service center (block 112).

In sum, the present technique provides for an RTU or OTS solution customized for application of monitoring a superconducting recondensing magnet system. An excitation circuitry may be integrated within the customized RTU, for example, to scale output to one or more of the magnet sensors. Additionally, one or more analog-to-digital converters within the RTU may be scaled to receive output from the sensors, the scaling based on the specific sensor and magnet types. It should be emphasized that the present technique may facilitate application of monitoring and control to most magnet types and vintages. The technique accommodates microprocessors in PC based or Linux based applications, as well as, the more rugged industrialized PLC based applications. The technique provides for continuous data logging or exceptional indication. The technique provides earlier warning of impending failures in the magnet system, and thus facilitates predictive maintenance, reduces maintenance costs, reduces MRI down time, reduces helium loss, and the like.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for monitoring a superconducting magnet system, comprising:
   determining a magnet system type and associated sensor types of the superconducting magnet system;
   selecting magnet settings for a monitoring system that monitors the superconducting magnet system, such settings generally corresponding to the determined magnet type and determined sensor types, and including one or more scaling factors for analog-to-digital conversion; and
   programming the monitoring system in accordance with the selected magnet settings.

2. The method of claim 1, comprising:
   providing an analog signal from a sensor disposed in the superconducting magnet system, such analog signal indicative of a property of the superconducting magnet system; and
   scaling an analog-to-digital conversion of the analog signal based on the one or more scaling factors.

3. The method of claim 2, further comprising scaling an excitation current for input to the sensor, and wherein the scaling of the excitation current is based on the magnet settings.

4. The method of claim 2, wherein the superconducting magnet system provides one or more magnetic fields in a magnetic resonance (MR) imaging system; and the monitoring system monitors at least one of a cryogen level, a cryogen pressure, a cryogen temperature, a cryogen shield temperature, a magnet current, a magnet field strength and corresponding frequency, a heater duty cycle, and a cold head temperature.

5. The method of claim 2, wherein the sensor is a resistance temperature detector (RTD) and the scaling factors comprise a selectable voltage setting and Callendar-Van Dusen coefficients.

6. The method of claim 2, further comprising comparing a value of the indicated property with a set point and indicating an alarm condition.

7. The method of claim 6, indicating an alarm condition comprises at least one of a local audible alarm, a local light, a remote alarm at an on-line service center, an e-mail message, and a pager message.

8. The method of claim 6, further comprising servicing or resetting the superconducting magnet system.

9. The method of claim 6, further comprising outputting a voltage control signal.

10. A method for monitoring a superconducting magnet system, comprising:
    selecting a magnet profile that corresponds to a magnet system type and associated sensor types of the superconducting magnet system;
    configuring a monitoring system that monitors the superconducting magnet system based on the selected profile, such profile including one or more scaling factors for analog-to-digital conversion;
    providing an analog signal from a sensor disposed in the superconducting magnet system, such analog signal representative of an operating variable of the superconducting magnet system; and
    scaling an analog-to-digital conversion of the analog signal based on the one or more scaling factors.

11. The method of claim 10, further comprising scaling an excitation current for input to the sensor, and wherein the scaling of the excitation current is determined by the magnet profile.

12. The method of claim 10, wherein the configuration of the monitoring system is performed automatically based upon the selected profile.

13. The method of claim 10, further comprising providing an output signal from the system to reduce helium boil-off, helium loss, MRI downtime, or MRI maintenance costs.

14. The method of claim 10, wherein the superconducting magnet system provides one or more magnetic fields in a magnetic resonance (MR) imaging system; and the operating variable of the superconducting magnet system is at least one of a cryogen level, a cryogen pressure, a cryogen temperature, a cryogen shield temperature, a magnet current, a magnet field strength and corresponding frequency, a heater duty cycle, a cold head temperature, and a compressor pressure.

15. The method of claim 10, further comprising comparing a value of the operating variable with a set point and indicating an alarm condition, such indication comprising at least one of a local audible alarm, a local light, a remote alarm at an on-line service center, an e-mail message, and a pager message.

16. The method of claim 15, further comprising servicing the superconducting magnet system or outputting a voltage control signal.

17. The method of claim 10, further comprising scaling conversion of a digital signal to an analog signal, such digital signal received from a second sensor disposed in the superconducting magnet.

18. A monitoring system for remotely monitoring a superconducting magnet system, comprising:
    a scalable analog-to-digital converter that measures an analog signal from a sensor disposed in the superconducting magnet system;
    a magnet selector interface for scaling the analog-to-digital converter and other monitoring system components to correspond to the particular sensor and to the type of superconducting magnet system being monitored;
    control and monitoring circuitry for processing a digital signal converted from the analog signal; and
    a communications module for sending signals to a remote host system and receiving signals from the remote host system.

19. The system of claim 18, further comprising scalable excitation circuitry that provides excitation current to the sensor, and wherein the excitation current is scaled to correspond to the particular sensor and the type of superconducting magnet system being monitored.

20. The system of claim 19, further comprising an integrated power supply for supplying excitation current to the sensor by supplying power to the excitation circuitry.

21. The system of claim 20, wherein the monitoring system comprises a remote terminal unit.

22. The system of claim 18, wherein the remote host system is an on-line service center.

23. A monitoring system for monitoring a superconducting magnet system, comprising:
a scalable analog digital converter with integrated excitation circuitry that provides an excitation current to a sensor disposed in the superconducting magnet system and that reads an analog signal from the sensor;
a magnet selector interface for scaling the analog-to-digital converter and integrated excitation circuitry based on the particular sensor and on the particular superconducting magnet system being monitored;
control and monitoring circuitry and a communications module for processing and sending data to a remote host system and for receiving and processing data from the remote host system; and
a power supply for supplying power to analog-to-digital converter and the integrated excitation circuitry.

24. The system of claim 23, wherein the remote host system is an on-line service center.

25. The system of claim 23, wherein the superconducting magnet system uses recondensing technology and is disposed in an MR imaging system.

26. A superconducting magnet system, comprising:
a cryogen vessel disposed in the superconducting magnet system and holding a cryogen for cooling one or more magnets;
a scalable analog-to-digital converter with integrated excitation circuitry that provides an excitation current to a sensor disposed in the superconducting magnet system and that reads an analog signal from the sensor;
a magnet selector interface for scaling the analog-to-digital converter and integrated excitation circuitry based on the particular sensor and on the particular superconducting magnet system being monitored;
control and monitoring circuitry and a communications module for processing and sending data to a remote host system and for receiving and processing data from the remote host system; and
a power supply for supplying power to analog-to-digital converter and the integrated excitation circuitry.

27. The system of claim 26, comprising:
a cold head configured for removing heat from the superconducting magnet and condensing cryogen vapor received from a vapor space of the cryogen vessel;
a refrigerant compressor system that supplies refrigerant to the cold head to cool the cold head;
a heater for vaporizing cryogen liquid and controlling pressure in the cryogen vessel; and
a relief vent disposed in the superconducting magnet system for relieving cryogen from the cryogen vessel.

28. The system of claim 27, wherein the superconducting magnet system is disposed within a magnetic resonance (MR) imaging system.

29. The system of claim 26, wherein the cryogen comprises helium.

30. The system of claim 29, wherein the pressure of the cryogen vessel is controlled in the approximate range of 4.0 to 4.5 psig and the temperature of the magnets is controlled at approximately 4 Kelvin.

31. A system for monitoring a recondensing superconducting magnet, comprising:
means for determining a magnet system type and associated sensor types of the superconducting magnet system;
means for selecting magnet settings for the monitoring system, such settings generally corresponding to the determined magnet type and determined sensor types, and including one or more scaling factors for analog-to-digital conversion; and
means for programming the monitoring system in accordance with the selected magnet settings.

32. The system of claim 31, comprising:
means for providing an analog signal from a sensor disposed in the superconducting magnet system, such analog signal indicative of a property of the superconducting magnet system; and
means for scaling an analog-to-digital conversion of the analog signal based on the one or more scaling factors.

33. The system of claim 32, further comprising means for scaling an excitation current for input to the sensor based on the magnet settings.

34. The system of claim 32, further comprising means for comparing a value of the indicated property with a set point and indicating an alarm condition.

35. The system of claim 32, further comprising means for servicing or resetting the superconducting magnet system.

36. The system of claim 32, further comprising means for outputting a voltage control signal.

37. A superconducting magnet system, comprising:
means for selecting a magnet profile that corresponds to a magnet system type and associated sensor types of the superconducting magnet system;
means for configuring a monitoring system based on the selected profile, such profile including one or more scaling factors for analog-to-digital conversion;
means for providing an analog signal from a sensor disposed in the superconducting magnet system, such analog signal representative of an operating variable of the superconducting magnet system;
means for scaling an analog-to-digital conversion of the analog signal based on the one or more scaling factors; and
means for communicating a value of the operating variable to a remote host system.

38. The system of claim 37, further comprising means for scaling an excitation current for input to the sensor, and wherein the scaling of the excitation current is determined by the magnet profile.

39. The system of claim 37, wherein the superconducting magnet system provides one or more magnetic fields in a magnetic resonance (MR) imaging system.

40. A computer program, provided on one or more tangible media, for operating a superconducting magnet system, comprising:
a routine for determining a magnet system type and associated sensor types of the superconducting magnet system;
a routine for selecting magnet settings for the monitoring system, such settings generally corresponding to the determined magnet type and determined sensor types, and including one or more scaling factors for analog-to-digital conversion;

a routine for programming the monitoring system in accordance with the selected magnet settings; and a routine for remotely monitoring the superconducting magnet system.

42. The computer program of claim 40, comprising:

a routine for providing an analog signal from a sensor disposed in the superconducting magnet system, such analog signal indicative of a property of the superconducting magnet system; and a routine for scaling an analog-to-digital conversion of the analog signal based on the one or more scaling factors.

42. The computer program of claim 41 further comprising a routine for scaling an excitation current for input to the sensor based on the magnet settings.

43. The computer program of claim 41, further comprising a routine for comparing a value of the indicated property with a set point and indicating an alarm condition.

44. The computer program of claim 43, further comprising a routine for outputting a voltage control signal.

45. A computer program, provided on one or more tangible media, for monitoring a superconducting magnet system, comprising:

a routine for selecting a magnet profile that corresponds to a magnet system type and associated sensor types of the superconducting magnet system;

a routine for configuring a monitoring system that monitors the superconducting magnet system based on the selected profile, such profile including one or more scaling factors for analog-to-digital conversion;

a routine for providing an analog signal from a sensor disposed in the superconducting magnet system, such analog signal representative of an operating variable of the superconducting magnet system;

a routine for scaling an analog-to-digital conversion of the analog signal based on the one or more scaling factors; and a routine for scaling an excitation current for input to the sensor, and wherein the scaling of the excitation current is determined by the magnet profile.

46. The computer program of claim 45, further comprising:

a routine for comparing a value of the operating variable with a set point; and a routine for indicating an alarm condition, such indication comprising at least one of a local audible alarm, a local light, a remote alarm at an on-line service center, an e-mail message, and a pager message.

47. The computer program of claim 46, further comprising a routine for outputting a voltage control signal.

* * * * *